United States Patent
Jeng et al.

[11] Patent Number: 6,033,962
[45] Date of Patent: Mar. 7, 2000

[54] METHOD OF FABRICATING SIDEWALL SPACERS FOR A SELF-ALIGNED CONTACT HOLE

[75] Inventors: Erik S. Jeng, Hsinchu; Hung-Yi Luo, Taipei; Yue-Feng Chen; Ming-Horn Tsai, both of Hsinchu, all of Taiwan

[73] Assignee: Vanguard International Semiconductor Corporation, Hsin-Chu, Taiwan

[21] Appl. No.: 09/121,692

[22] Filed: Jul. 24, 1998

[51] Int. Cl.[7] .................... H01L 21/336; H01L 21/8234
[52] U.S. Cl. .......................... 438/301; 438/238
[58] Field of Search .................. 438/238, 243, 438/301, 649, 666, 253

[56] References Cited

U.S. PATENT DOCUMENTS

| | | | |
|---|---|---|---|
| 4,966,870 | 10/1990 | Barber et al. | 437/228 |
| 5,422,315 | 6/1995 | Robayashi | 437/228 |
| 5,576,242 | 11/1996 | Liu | 437/191 |
| 5,605,864 | 2/1997 | Prall | 437/195 |
| 5,643,824 | 7/1997 | Chien et al. | 437/69 |
| 5,679,607 | 10/1997 | Liu | 437/200 |
| 5,763,303 | 6/1998 | Liaw et al. | 438/210 |
| 5,780,338 | 7/1998 | Jeng et al. | 438/253 |
| 5,792,684 | 8/1998 | Lee et al. | 438/238 |
| 5,843,815 | 12/1998 | Liaw | 438/238 |
| 5,854,135 | 12/1998 | Ko | 438/301 |
| 5,899,742 | 5/1999 | Sun | 438/649 |

*Primary Examiner*—John F. Niebling
*Assistant Examiner*—Walter L. Lindsay, Jr.
*Attorney, Agent, or Firm*—George O. Saile; Stephen B. Ackerman

[57] ABSTRACT

A method for forming a self-aligned contact, (SAC), opening, for a semiconductor device, has been developed. The process features the formation of partial silicon nitride spacers, on the sides of polycide gate structures, via a partial anisotropic RIE procedure, applied to a silicon nitride layer, also resulting in a thin layer of silicon nitride remaining on regions between polycide gate structures. After deposition of an overlying insulator layer, a two step, anisotropic RIE procedure is used to create the SAC opening in the insulator layer, and in the underlying, thin silicon nitride layer. The first step, of the two step, SAC opening procedure, selectively removes first insulator layer, while the second step, of the two step, SAC opening procedure, selectively removes the thin silicon nitride layer.

25 Claims, 3 Drawing Sheets

METHOD OF FABRICATING SIDEWALL SPACERS FOR A SELF-ALIGNED CONTACT HOLE

BACKGROUND OF THE INVENTION (1) Field of the Invention

The present invention relates to a process used to fabricate semiconductor devices, and more specifically to a process used to create insulator spacers, on the sides of a gate structure.

(2) Description of Prior Art

The semiconductor industry is continually striving to improve the performance of semiconductor devices, while still maintaining, or decreasing the manufacturing costs for these same semiconductor devices. The arrival of micro-miniaturization, or the ability to fabricate semiconductor devices using sub-micron features, have contributed to the attainment of the performance and cost objectives. Semiconductor devices comprised with sub-micron features result in a decrease in performance degrading capacitances and resistances. In addition the use of sub-micron features allows smaller semiconductor chips, still containing device densities achieved with larger counterparts, to be realized, thus resulting in a greater number of semiconductor chips to be obtained from a specific size starting substrate, thus reducing the processing cost for a specific semiconductor chip. Specific semiconductor fabrication disciplines such as photolithography and dry etching, have been major contributors of the trend to micro-miniaturization. For example the use of more sophisticated exposure cameras, as well as the use of more sensitive photosensitive materials, have allowed sub-micron images to be routinely formed in photoresist layers. In addition the development of more advanced dry etching tools and processes, have allowed the sub-micron images, in photoresist layers, to be successfully transferred to underlying materials, used in construction of semiconductor devices.

However, in addition the contributions made via use of advanced semiconductor fabrication disciplines, specific structural contributions, such as the use of a self-aligned contact, (SAC), structure, has also enabled smaller, faster, semiconductor devices to be successfully realized. The SAC concept entails opening a contact hole, to expose a source/drain region, located between gate structures. In order to maintain a minimum space between gate structures, and to have a SAC structure fully land on the source/drain region, the diameter of the contact hole, used to expose the source/drain, would have to be smaller then current photolithographic technology can now supply. Therefore the SAC concept is used, opening a hole larger in width than the space between gate structures, exposing the source/drain region, however also exposing a top portion of the neighboring gate structures. The gate structures are comprised of a top layer of silicon nitride, as well as silicon nitride spacers, on the sides of the gate structure. Therefore a subsequent, conductive SAC structure, is formed, larger in width than the diameter of the SAC opening, thus contacting the source/drain region, in the SAC opening, however interfacing only regions of silicon nitride, in areas in which the conductive SAC structure, overlaps the SAC opening.

The SAC opening is formed in an insulator layer, usually a boro-phosphosilicate, (BPSG), layer. The BPSG layer is deposited, after insulator spacer formation, directly overlying exposed source/drain regions. With this scenario, dopants such as boron and phosphorous, residing in the BPSG layer, can interface and diffuse into exposed source/drain region, resulting in unwanted compensation of the these regions. In addition the SAC opening, performed using an anisotropic RIE procedure, can result in removal of silicon oxide isolation regions, at end point, or during an overetch cycle. This invention will describe a procedure for forming SAC openings, without the vulnerability of doping exposed source/drain regions, or without damage to silicon oxide isolation regions. This invention features a partial formation of silicon nitride spacers, leaving a thin layer of silicon nitride on the source/drain regions, between gate structures. The thin silicon nitride layer protects the source/drain region from BPSG out diffusion. This invention also features a two step SAC opening procedure, comprised of a first step in which the RIE chemistry removes BPSG at a much greater rate than silicon nitride, thus stopping at the thin silicon nitride layer, followed by a second RIE procedure, used to remove the thin silicon nitride layer, using a RIE chemistry that results in faster removal rates of silicon nitride, compared to silicon oxide. Prior art, such as Chien, et al, in U.S. Pat. No. 5,643,824, describe a process for using silicon nitride extensions, to prevent "birds beak" formation during the growth of field oxide regions. In addition Barber et al, in U.S. Pat No. 4,966,870, describe a process for fabricating a borderless contact. However these prior arts do not use a thin silicon nitride layer, overlying source/drain regions, nor does it use a two step, anisotropic RIE procedure to selectively form a SAC opening, and then to selectively remove the thin silicon nitride layer.

SUMMARY OF THE INVENTION

It is an object of this invention to form a SAC structure for a metal oxide semiconductor field effect transistor, (MOSFET), device.

It is another object of this invention to partially form silicon nitride spacers, on the sides of gate structures, leaving a thin layer of silicon nitride remaining between gate structures, overlying a source/drain region;

It is still another object of this invention to open an initial SAC hole, in a BPSG layer, stopping on the thin silicon nitride layer, using an anisotropic RIE procedure that removes BPSG at a faster rate than silicon nitride.

It is still yet another object of this invention to complete the opening of the SAC hole, via removal of the thin silicon nitride layer, exposing a source/drain region, between gate structures, using an anisotropic RIE procedure, that removes silicon nitride at a faster rate than BPSG or silicon oxide.

In accordance with the present invention a process for forming a SAC structure, featuring partially formed silicon nitride spacers, and using a two stage RIE procedure, for the SAC hole formation, designed to protect source/drain and isolation regions, from overlying layers, and from RIE overetch phenomena, is described. Gate structures, on a gate insulator layer, and on a isolation region, are provided, including a source/drain region in a semiconductor substrate, located between gate structures. A silicon nitride layer is deposited and partially etched back, via an anisotropic RIE procedure, to create silicon nitride spacers on the sides of gate structures, while leaving a thin silicon nitride layer, between the gate structures, overlying the source/drain region. A BPSG layer is next deposited, followed by the first stage of a SAC hole opening procedure, using photolithographic, and anisotropic RIE procedures. The etch chemistry used for the first stage of the RIE procedure is chosen to selectively remove BPSG at a faster rate than the removal rate for silicon nitride, allowing the first stage of the SAC hole opening to terminate on the thin silicon nitride layer. After removal of the masking photoresist shape, the second stage of the SAC hole opening is performed, using an etch chemistry that selectively etches silicon nitride at a faster rate than the removal rate for BPSG or silicon oxide, allowing the thin silicon nitride layer, between gate structures, to be removed, exposing the source/drain region. Metal, or polysilicon deposition, followed by a patterning procedure, results in the SAC structure, contacting the source/drain region, in the SAC hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
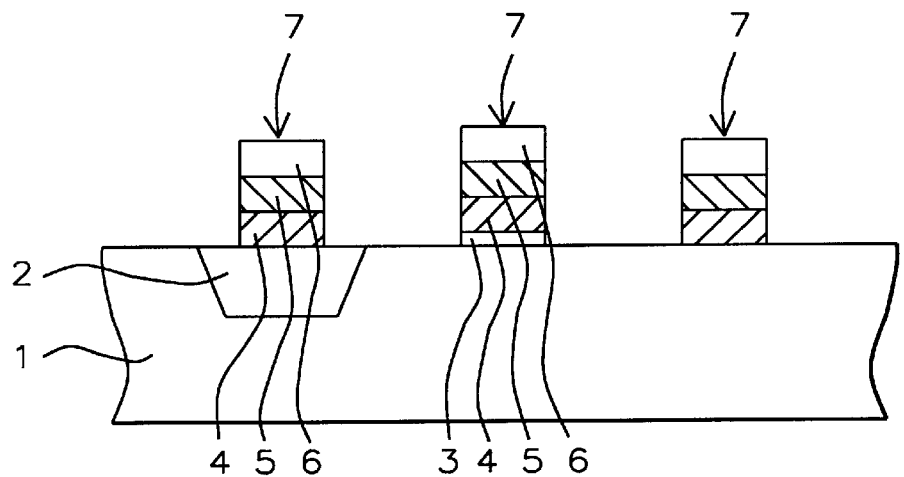
FIGS. 1–7, which schematically in cross-sectional style, show key stages of fabrication, used to create the SAC structure, featuring partially etched silicon nitride spacers, and featuring a two stage anisotropic RIE procedure, used to selectively open a SAC hole, without damaging adjacent regions during an overetch cycle.

The process used to fabricate a SAC structure, using partially formed silicon nitride spacers, and using a two stage, RIE procedure, to selectively open a SAC hole, will now be described in detail. A P type, semiconductor substrate 1, having a <100> crystallographic orientation, is used and schematically shown in FIG. 1. Shallow trench isolation, (STI) region 2, is formed via initially etching a shallow trench in semiconductor substrate 1, using conventional photolithographic and anisotropic reactive ion etching, (RIE), procedures, using $Cl_2$ as an etchant. After removal of the masking photoresist shape, via plasma oxygen ashing and careful wet cleans, a deposition of silicon oxide is performed, using low pressure chemical vapor deposition, (LPCVD), or plasma enhanced chemical vapor deposition, (PECVD), procedures, completely filling the shallow trench. A chemical mechanical polishing, (CMP), procedure, or a selective RIE procedure, using $CHF_3$ as an etchant, is used to remove insulator layer, from the top surface of semiconductor substrate 1, resulting in STI region 2, schematically shown in FIG. 1. Thermally grown, field oxide, (FOX), regions, can also be used as isolation regions, in place of STI regions 2, if desired.

After a series of wet clean steps, including a buffered hydrofluoric acid cycle, gate insulator layer 3, comprised of silicon dioxide, is thermally grown to a thickness between about 50 to 100 Angstroms. A polysilicon layer 4, is next deposited, using LPCVD procedures, to a thickness between about 500 to 1000 Angstroms, followed by the deposition of a metal silicide layer 5, comprised of either tungsten silicide, or titanium silicide, via either LPCVD, or R.F. sputtering procedures, to a thickness between about 500 to 1000 Angstroms. The combination of a metal silicide layer on a polysilicon layer, or the polycide layer, shown schematically in FIG. 1, improves the conductivity of the subsequent gate structure. A silicon nitride layer 6, is then deposited, via LPCVD or PECVD procedures, to a thickness between about 1000 to 2500 Angstroms. Conventional photolithographic and anisotropic RIE procedures, using $CHF_3$—$CF_4$—Ar—$O_2$ as an etchant for silicon nitride layer 6, and using $Cl_2$ as an etchant for metal silicide layer 5, and polysilicon layer 4, are employed to create silicon nitride capped, polycide gate structures 7, schematically shown in FIG. 1.

Figure 2:
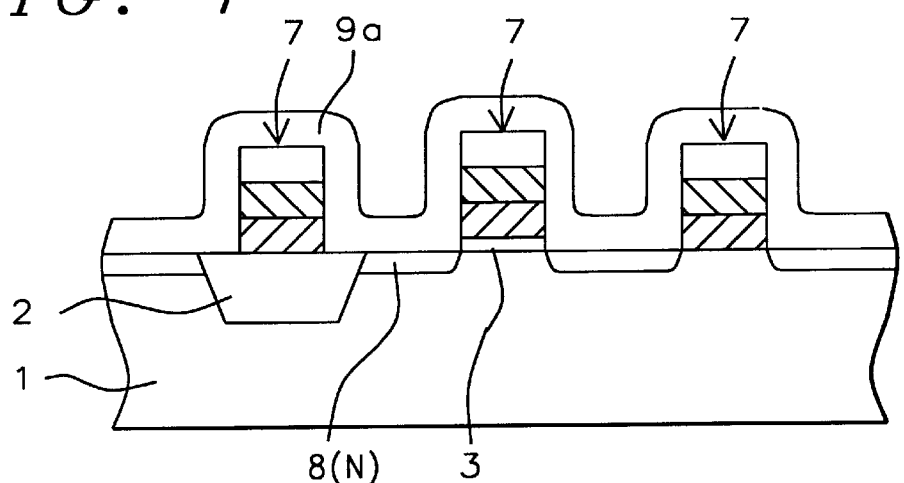
Figure 3:
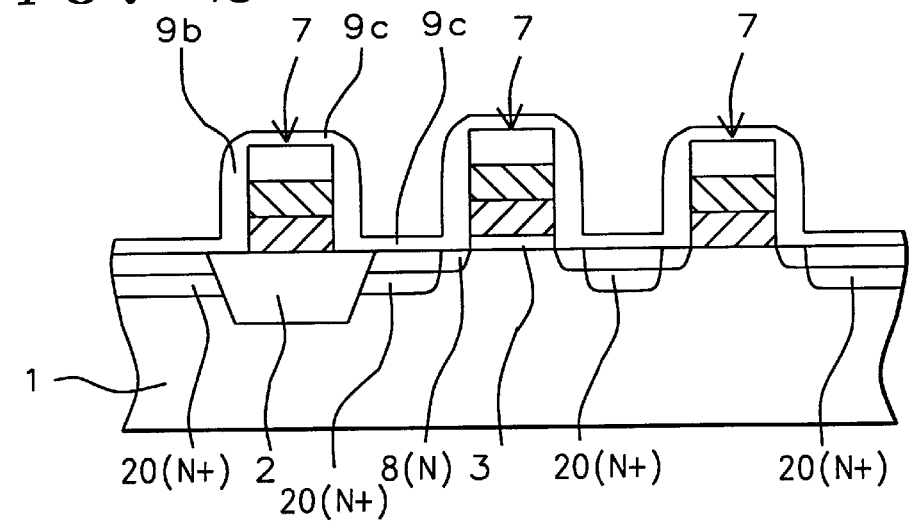

N type, source/drain regions 8, are next formed via ion implantation of arsenic or phosphorous ions, at an energy between about 20 to 40 KeV, at a dose between about 1E12 to 1E14 atoms/cm. A silicon nitride layer 9a, shown schematically in FIG. 2, is then deposited, via LPCVD or PECVD procedures, to a thickness between about 400 to 1000 Angstroms. A key feature of this invention, the partial etchback of silicon nitride layer 9a, is next addressed. An anisotropic RIE procedure, using $CHF_3$—Ar, as an etchant, is used to form silicon nitride spacers 9b, on the sides of polycide gate structures 7, while leaving silicon nitride layer 9c, between about 100 to 200 Angstroms in thickness, overlying source/drain regions 8, and overlying the top of silicon nitride capped, polycide gate structures 7. In addition thin silicon nitride layer 9c, resides on the surface of STI region 2, in a region in which STI region 2, is not covered by silicon nitride capped, polycide gate structure 7. This is schematically shown in FIG. 3. Thin silicon nitride layer 9c, will protect source/drain region 8, from a subsequent overlying boro-phosphosilicate, (BPSG), layer, regarding outdiffusion of boron or phosphorous, resulting in dopant compensation of source/drain regions 8. A heavily doped source/drain region 20, is formed via ion implantation of arsenic, through thin silicon nitride layer 9c, at an energy between about 40 to 50 KeV, at a dose between about 1E14 to 1E16 atoms/$cm^2$.

Figure 4:
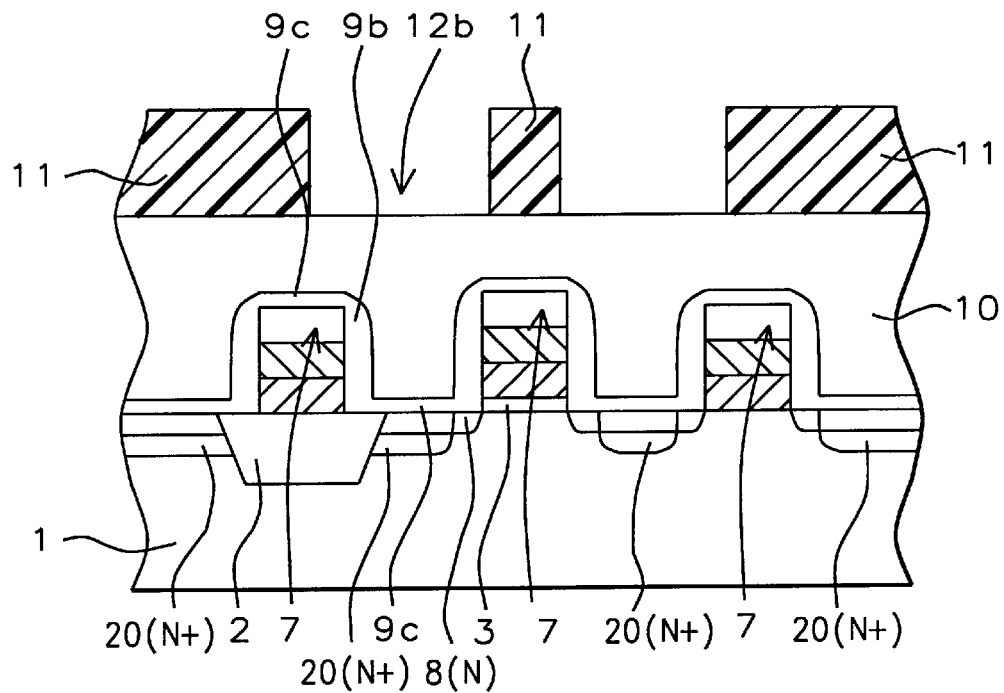
Figure 5:
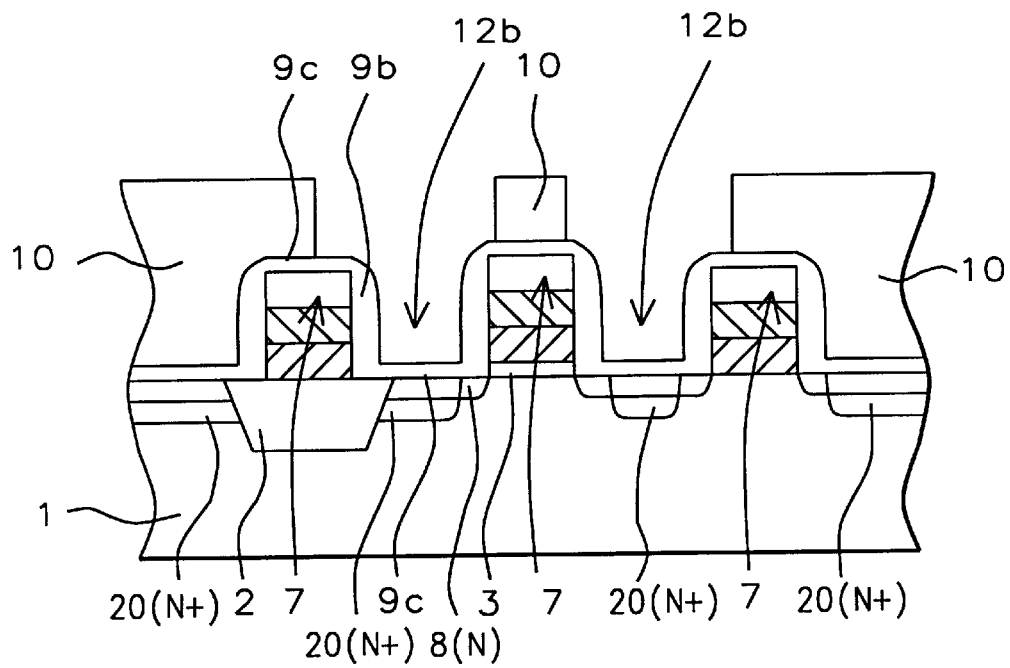

A BPSG layer 10, comprised of between about 3 to 8 weight % $B_2O_3$, and between about 3 to 10 weight % $P_2O_5$, is deposited via LPCVD or PECVD procedures, to a thickness between about 5000 to 10000 Angstroms. An undoped silicate glass, (USG), can also be used if desired. A chemical mechanical polishing procedure is then used for planarization purpose, resulting in a smooth top surface topography for BPSG layer 10. This is schematically shown in FIG. 4. A photoresist shape 11, with openings 12a, shown schematically in FIG. 4, is next formed on BPSG layer 10, exposing a region to be used for the subsequent SAC opening. Another key feature of this invention, the creation of self-aligned contact, (SAC), opening 12b, in BPSG layer 10, is next addressed. The first step, of a two step, SAC opening procedure, using an anisotropic RIE procedure, using $C_4F_8$—CO—Ar—$O_2$ as an etchant for BPSG layer 10, is next performed, creating SAC opening 12b. Via use of this etch chemistry, BPSG layer 10, is removed at a rate between about 10 to 20 times, faster than the removal rate of silicon nitride, thus allowing complete removal of BPSG layer 10, exposed in opening 12a, of photoresist mask 11, to be accomplished. In addition the selectivity of this RIE procedure, also allows an overetch cycle, insuring complete removal of exposed BPSG layer 10, possibly thicker in regions of non-uniformity, to be performed without risk to the protective thin silicon nitride layer 9c. Silicon oxide, in STI region 2, is also protected by thin silicon nitride layer 9c. Photoresist shape 11, is removed via plasma oxygen ashing and careful wet cleans, The result of forming SAC opening 12b, in BPSG layer 10, without exposing source/drain regions 8, to possible boron or phosphorous compensation, is schematically shown in FIG. 5.

Figure 6:
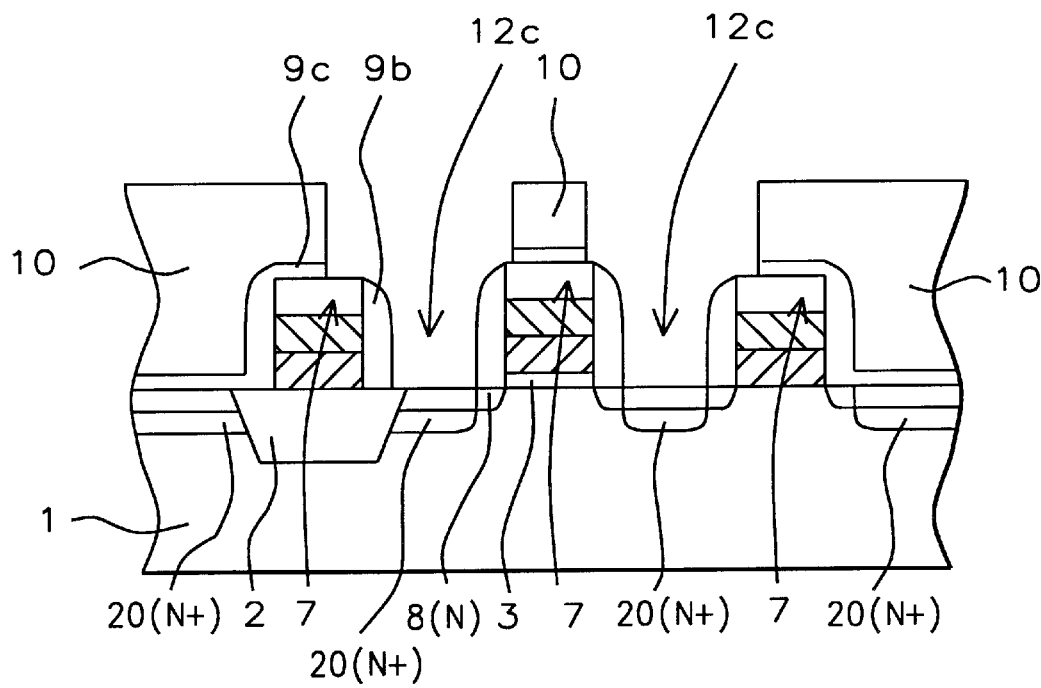
Figure 7:
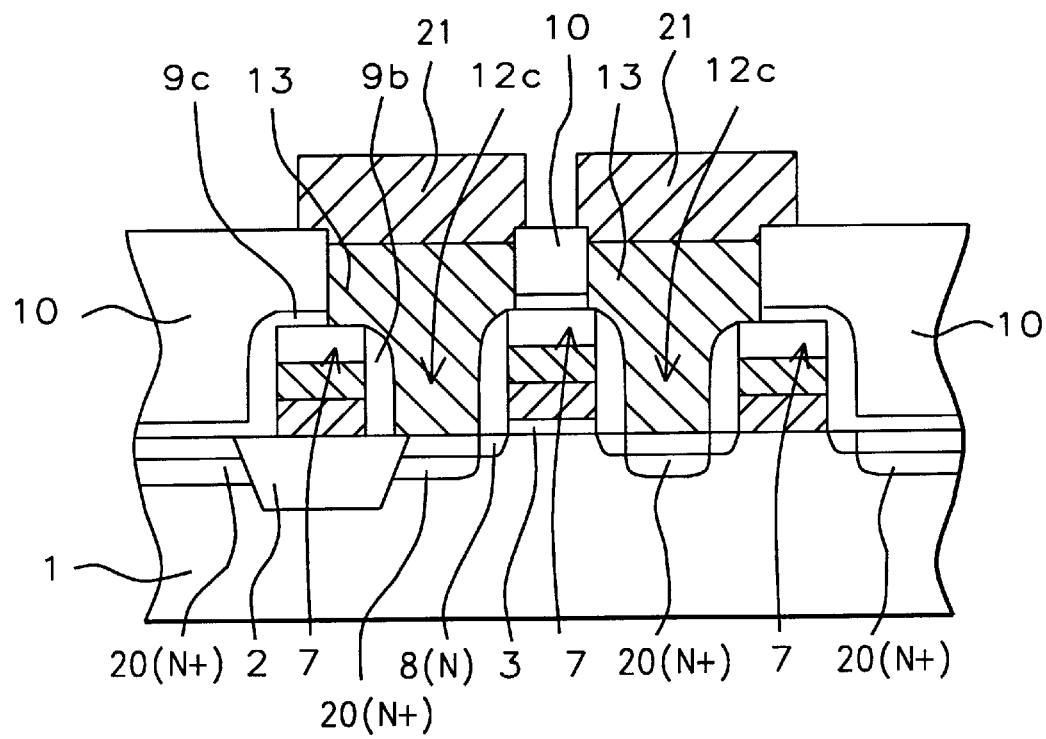

The second step, of the two step, SAC opening, is next performed, using $CH_2F_2$—$CHF_3$—Ar—$O_2$ as an etchant to selectively remove thin silicon nitride layer 9c, exposed in SAC opening 12b. This is accomplished via an anisotropic RIE procedure, in which the etch chemistry removes silicon nitride at a rate between about 5 to 20 times faster than the removal rate of either BPSG layer 10, silicon oxide in STI region 2, or silicon exposed in source/drain region 8. The result of this procedure results in the completion of SAC opening 12c, schematically shown in FIG. 6. SAC opening 12c, formed using a two step, RIE procedure, and made possible via use the partially formed silicon nitride spacers 9b, is created without RIE damage to neighboring regions, such as source/drain region 8, or STI region 2, and is created without dopant compensation of source/drain region 8, by overlying BPSG layer 10. FIG. 7, schematically shows the formation of a SAC structure 13, residing in, and larger in width than, SAC opening 12c. The procedure for forming SAC structure 13, is the deposition of a conductive material such as a metal, a polycide, or a polysilicon layer. The deposition of a metal, such as tungsten, is accomplished using LPCVD or R.F. sputtering procedures, while deposition of a polysilicon layer, or of a polycide layer, such as tungsten silicide or titanium silicide, is accomplished using LPCVD procedures. The thickness of the conductive layer is between about 3000 to 6000 Angstroms. Conventional RIE etchback procedures, without the use of photoresist masking, using $Cl_2$—$SF_6$—$BCl_3$—Ar as an etchant, are used to form the SAC structures 13, or plugs, schematically shown in FIG. 7. Finally metal interconnect structures 21, are created, via a deposition of an aluminum based metal layer, followed by conventional patterning procedures, using $Cl_2$ as an etchant for the aluminum based metal layer.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a self-aligned contact, (SAC), opening, for a semiconductor device, on a semiconductor substrate, comprising the steps of:

providing an isolation region, in said semiconductor substrate;

providing a gate insulator layer on regions of said semiconductor substrate, not occupied by said isolation region;

forming gate structures on said gate insulator layer;

forming source/drain regions, in said semiconductor substrate, in regions of said semiconductor substrate not covered by said gate structures;

depositing a first insulator layer;

performing an anisotropic reactive ion etching, (RIE), procedure, removing a top portion of said first insulator layer, leaving a thin first insulator layer on said source/drain region, between said gate structures, leaving a thin first insulator layer on the top surface of said gate structures, and leaving a thin first insulator layer on the top surface of a portion of said isolation region, while forming partial first insulator spacers on the top sides of said gate structures;

depositing a second insulator layer;

planarizing said second insulator layer;

forming a first SAC opening, in said second insulator layer, exposing the top surface of said thin first insulator layer, overlying said source/drain regions, and exposing said partial first insulator spacers;

removing said thin first insulator layer, exposed in said first SAC opening, creating a second SAC opening, exposing said source/drain region, and creating complete first insulator spacers, on the entire sides of said gate structures; and forming SAC structures, contacting said source/drain regions, exposed in said second SAC opening.

2. The method of claim 1, wherein said isolation region, is a silicon oxide filled, shallow trench, where shallow trench is formed in said semiconductor substrate via an anisotropic RIE procedure, using $Cl_2$ as an etchant, and the silicon oxide, in shallow trench, is obtained via LPCVD or PECVD procedures, and removed from the top surface of said semiconductor substrate, via an anisotropic RIE procedure, using $CHF_3$ as an etchant, or via a chemical mechanical polishing procedure.

3. The method of claim 1, wherein said gate insulator layer is silicon dioxide, obtained via thermal oxidation procedures, to a thickness between about 50 to 100 Angstroms.

4. The method of claim 1, wherein said gate structures are comprised of a silicon nitride capped, polycide structures, in which the polycide structures are comprised of an overlying metal silicide layer, such as tungsten silicide or titanium silicide, obtained via LPCVD or R.F. sputtering procedures, at a thickness between about 500 to 1000 Angstroms, and an underlying polysilicon layer, obtained using LPCVD procedures, at a thickness between about 500 to 1000 Angstroms.

5. The method of claim 1, wherein said silicon nitride capped, gate structures, are formed via an anisotropic RIE procedure, using $CF_4$—$CHF_3$—Ar—$O_2$ as an etchant for silicon nitride, while using $Cl_2$ as an etchant for the metal silicide and polysilicon layers.

6. The method of claim 1, wherein said first insulator layer is silicon nitride, obtained using an LPCVD or a PECVD procedure, to a thickness between about 400 to 1000 Angstroms.

7. The method of claim 1, wherein said partial first insulator spacers are formed via an anisotropic RIE procedure, applied to said first insulator layer, using $CHF_3$—Ar as an etchant, resulting in said thin first insulator layer, at a thickness between about 100 to 200 Angstroms, remaining on said source/drain region, between said gate structures.

8. The method of claim 1, wherein said second insulator layer is comprised of a boro-phosphosilicate glass, (BPSG), layer, obtained using an LPCVD or a PECVD procedure, to a thickness between about 5000 to 10000 Angstroms, with said second insulator layer containing between about 3 to 8 weight % $B_2O_3$, and between about 3 to 10 weight % $P_2O_5$.

9. The method of claim 1, wherein said second insulator layer is an undoped silicon oxide layer, obtained via an LPCVD or a PECVD procedure, at a thickness between about 5000 to 10000 Angstroms.

10. The method of claim 1, wherein said first SAC opening, is formed in said second insulator layer via an anisotropic RIE procedure, using $C_4F_8$—CO—Ar—$O_2$ as an etchant, with an etch rate selectivity between said second insulator layer, and said first insulator layer, of about 20 to 1.

11. The method of claim 1, wherein said second SAC opening is formed via an anisotropic RIE procedure, using $CH_2F_2$—$CHF_3$—Ar—$O_2$ as an etchant, applied to said thin first insulator layer, exposed in said first SAC opening, with an etch rate selectivity between said first insulator layer, and said second insulator layer, of 20 to 1.

12. The method of claim 1, wherein said SAC structure is formed via deposition of a metal such as tungsten, or a polycide such as tungsten silicide on polysilicon, or a polysilicon layer, using an LPCVD procedure, at a thickness between about 3000 to 6000 Angstroms, followed by an anisotropic RIE patterning procedure, using $Cl_2$—$SF_6$—$BCl_3$—Ar an etchant.

13. A method of using a two step, anisotropic RIE procedure, and partial silicon nitride spacers, to create a self-aligned contact, (SAC), opening, in a composite insulator layer, for a semiconductor device, on a semiconductor substrate, comprising the steps of:

forming a shallow trench isolation region in said semiconductor substrate;

growing a silicon dioxide gate insulator layer, on said semiconductor substrate;

depositing a polysilicon layer;

depositing a tungsten silicide layer;

depositing a first silicon nitride layer;

forming a polycide, (tungsten silicide-polysilicon), gate structure, capped by said first silicon nitride layer, on said silicon dioxide gate insulator layer;

forming source/drain regions in areas of said semiconductor substrate, not covered by silicon nitride capped, said polycide gate structures;

depositing a second silicon nitride layer;

performing an anisotropic RIE procedure, on said second silicon nitride layer, creating said partial silicon nitride spacers, on the top sides of said polycide gate structures, while leaving a thin second silicon nitride layer, on said source/drain regions, leaving a thin second silicon nitride layer on the top surface of said polycide gate structures, and leaving a thin second silicon nitride layer on the top surface of a portion of said shallow trench isolation region;

depositing a boro-phosphosilicate glass, (BPSG), layer;

planarizing said BPSG layer;

performing a first step, of said two step anisotropic RIE procedure, selectively removing said BPSG layer, and creating a first SAC opening in said BPSG layer, exposing said thin second silicon nitride layer, and exposing said partial silicon nitride spacers;

performing a second step, of said two step anisotropic RIE procedure, selectively removing said thin second silicon nitride layer, exposed in said first SAC opening, and creating a second SAC opening, exposing said source/drain region, while forming complete silicon nitride spacers, on the entire sides of said polycide gate structures; and forming SAC structures, contacting said source/drain region, in said second SAC opening.

14. The method of claim 13, wherein said shallow trench isolation regions are formed by creating a shallow trench, in said semiconductor substrate, via an anisotropic RIE procedure, using $Cl_2$ as an etchant, and filling the shallow trench with a silicon oxide layer, obtained via an LPCVD or a PECVD procedure.

15. The method of claim 13, wherein said silicon dioxide gate insulator layer is formed using a thermal oxidation procedure, to a thickness between about 50 to 100 Angstroms.

16. The method of claim 13, wherein said polycide gate structures are comprised of an overlying tungsten silicide layers, obtained via an LPCVD, or a R.F. sputtering procedure, at a thickness between about 500 to 1000 Angstroms, and an underlying polysilicon layer, obtained using an LPCVD procedure, at a thickness between about 500 to 1000 Angstroms.

17. The method of claim 13, wherein said first silicon nitride layer is deposited using LPCVD or PECVD procedures, to a thickness between about 1000 to 2500 Angstroms.

18. The method of claim 13, wherein said polycide gate structures, capped with said first silicon nitride layer, are formed via an anisotropic RIE procedure, using $CF_4$—$CHF_3$—$Ar$—$O_2$ as an etchant for said first silicon nitride layer, while using $Cl_2$ as an etchant for said tungsten silicide layer, and for said polysilicon layer.

19. The method of claim 13, wherein said source/drain regions are formed via ion implantation of arsenic or phosphorous ions, at an energy between about 20 to 40 KeV, at a dose between about 1E12 to 1E14 atoms/cm$^2$.

20. The method of claim 13, wherein said second silicon nitride layer is deposited using LPCVD or PECVD procedures, to a thickness between about 400 to 1000 Angstroms.

21. The method of claim 13, wherein said partial silicon nitride spacers are formed on the top sides of said polycide gate structures, via an anisotropic RIE procedure, using $CHF_3$—$Ar$ as an etchant.

22. The method of claim 13, wherein said thin second silicon nitride layer, has a thickness between about 100 to 200 Angstroms.

23. The method of claim 13, wherein said BPSG layer is deposited using LPCVD or PECVD procedures, to a thickness between about 5000 to 10000 Angstroms, and comprised of between about 3 to 8 weight % $B_2O_3$, and between about 3 to 10 weight % $P_2O_5$.

24. The method of claim 13, wherein said first SAC opening, is created in said BPSG layer, via a first step, of said two step anisotropic RIE procedure, using $C_4F_8$—$CO$—$Ar$—$O_2$ as an etchant, with an etch rate ratio of said BPSG layer, to said thin second silicon nitride layer, of about 20 to 1.

25. The method of claim 13, wherein said second SAC opening, is created in said thin second silicon nitride layer, via a second step, of said two step anisotropic RIE procedure, using $CH_2F_2$—$CHF_3$—$Ar$—$O_2$ as an etchant, with an etch rate ratio of said thin second silicon nitride layer, to said BPSG layer, or to silicon oxide, in said shallow trench isolation region, of about 20 to 1.

* * * * *